United States Patent [19]

Spangler et al.

[11] Patent Number: 5,006,963
[45] Date of Patent: Apr. 9, 1991

[54] SELECTABLE CHIP CARRIER

[75] Inventors: James B. Spangler, Tustin; Steve G. Rector, Riverside, both of Calif.

[73] Assignee: McDonnell Douglas Corporation, Long Beach, Calif.

[21] Appl. No.: 451,639

[22] Filed: Dec. 18, 1989

[51] Int. Cl.⁵ ............................................ H01L 23/02
[52] U.S. Cl. .................................................... 361/417
[58] Field of Search ............... 174/52.4, 261; 361/417, 361/395, 399, 406, 409, 412, 414, 380

[56] References Cited

U.S. PATENT DOCUMENTS

| | | | |
|---|---|---|---|
| 3,729,820 | 5/1973 | Ihochi et al. | 174/52.4 X |
| 4,489,365 | 12/1984 | Daberkoe | 361/403 |
| 4,513,355 | 4/1985 | Schroeder et al. | 174/52.4 X |
| 4,536,638 | 8/1985 | Krynicki | 219/121 |
| 4,684,184 | 8/1987 | Grabbe et al. | 439/64 |
| 4,699,593 | 10/1987 | Grabbe et al. | 439/71 |
| 4,703,920 | 11/1987 | Grabbe et al. | 269/37 |
| 4,705,917 | 11/1987 | Gates, Jr. et al. | 174/52.4 |
| 4,706,811 | 11/1987 | Jung et al. | 206/331 |
| 4,782,381 | 11/1988 | Ruby et al. | 357/74 |
| 4,810,616 | 3/1989 | Grabbe et al. | 430/269 |
| 4,829,666 | 5/1989 | Haghiri-Tehani et al. | 29/841 |
| 4,860,165 | 8/1989 | Cassinelli | 361/414 X |
| 4,903,113 | 2/1990 | Frankeny et al. | 174/52.4 X |
| 4,907,128 | 3/1990 | Solomon et al. | 361/412 |

Primary Examiner—Leo P. Picard
Assistant Examiner—Paramita Ghosh
Attorney, Agent, or Firm—Gregory A. Cone; John P. Scholl

[57] ABSTRACT

A selectable chip carrier is disclosed which is adapted to receive an integrated circuit chip having a plurality of terminals disposed about its periphery and to allow for the connection of selected ones of these terminals to selected voltage potentials, ground, or signal lines using relatively short, non-overlapping leads.

13 Claims, 3 Drawing Sheets

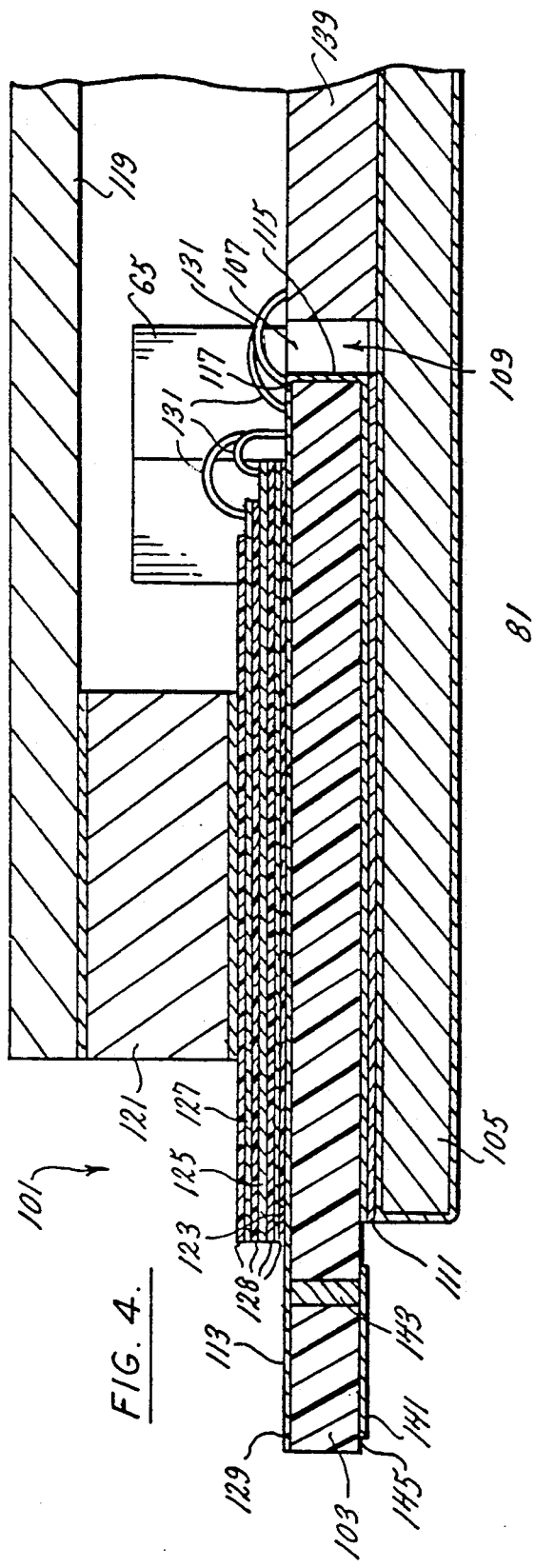
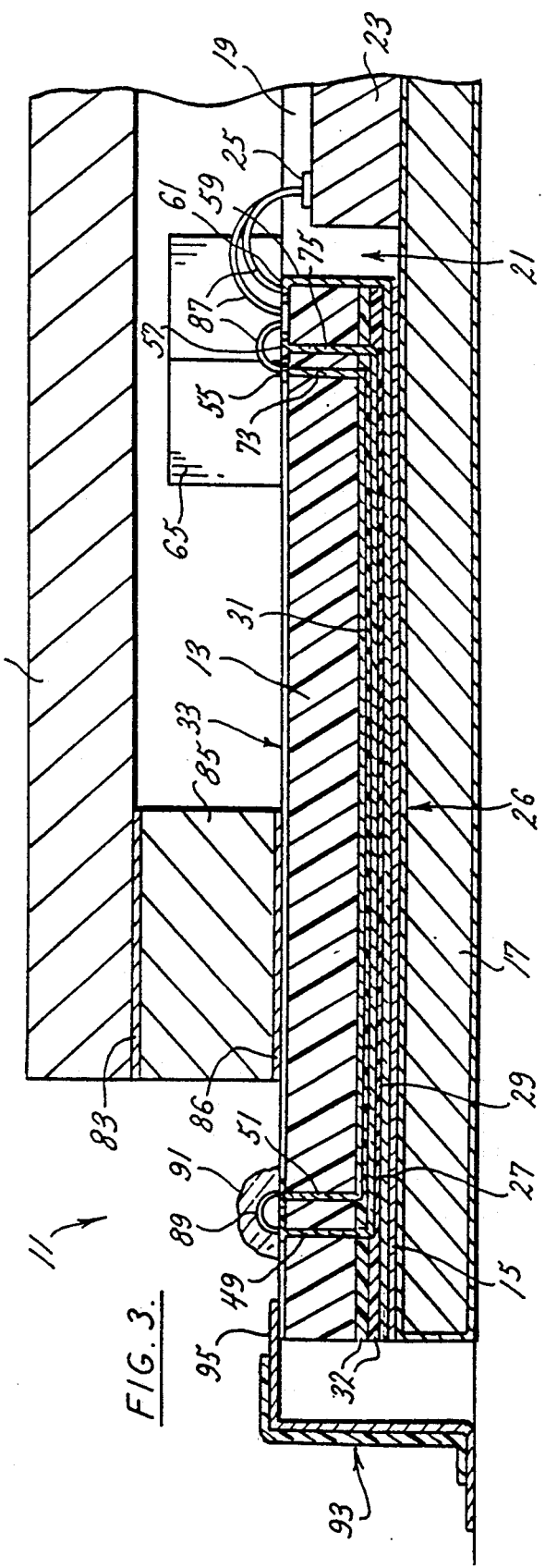

SELECTABLE CHIP CARRIER

FIELD OF THE INVENTION

The invention relates to the field of electronics packaging and more particularly to electronic integrated circuit chip carriers adapted to receive integrated circuit chips and to supply the terminals of such chips with connections to input and output signals, shielding and ground potentials, and decoupled bus voltages.

BACKGROUND OF THE INVENTION

As described for example in U.S. Pat. No. 4,782,381, over the years integrated circuit (IC) structures have taken on several different configurations and have increased in complexity and capacity. Very large scale integration (VLSI) has now become very popular, where each such package includes hundreds of input and output terminals as well as operating potential terminals. Usually these terminals take the form of conductive pads or bumps. As every application usually requires different electrical functions to be performed, there are literally thousands of VLSI packages that have different assignments for similar terminal pad positions.

Although the electronics industry has tried to standardize micro electronic circuits in the form of integrated circuit chips, there are many more circuit designs that do not follow standards with respect to internal designs and external lead or pad placement or position.

Often, these special or proprietary chips have high pin counts and are arranged in non-standard, non-symmetrical pad patterns. Also, these devices usually have very high power dissipations and require very low power lead voltage drops for proper operation. Accordingly, most manufacturers are forced to design and build custom chip carriers for each I.C. design.

There are certain problems related to the use of custom chip carriers beyond the obvious one of the cost of designing a new chip carrier for each new I.C. Such a problem is in the area of scheduling. That is, most manufacturers experience difficulty in being able to provide a custom chip carrier in time to immediately accommodate a newly designed special I.C. chip. This is because the pad pattern for the I.C. is often not firmly established until just prior to releasing the design for part fabrication. The I.C. manufacturing process often takes as much as eight weeks, which is not sufficient time to design and fabricate a suitable custom chip carrier.

Therefore, it should be evident that there is a need for an easily fabricated selectable chip carrier that can be customized to match the requirements of a particular integrated circuit, and that the providing of such a device would constitute a significant advancement in the art.

SUMMARY OF THE PRESENT INVENTION

In accordance with the present invention, a selectable chip carrier is provided that is adapted to receive an integrated circuit chip having a plurality of conductive terminal pads disposed about its periphery and to allow communication by selected ones of these terminal pads to a desired voltage potential, a ground, and to I/O signal lines. The invention generally comprises a base plate having an upper surface adapted to support an integrated circuit chip, a dielectric substrate having an outer periphery and upper and lower planar surfaces and supported by the upper surface of the base plate, where the substrate includes an integrated circuit chip-accommodating aperture therethrough defining an inner periphery of the substrate. The invention also comprises a plurality of parallel and insulatively separated planar conductive layers disposed adjacent one of the planar surfaces of the substrate, where the conductive layers also include an integrated circuit chip-accommodating aperture therethrough defining an inner periphery of the conductive layers which is generally coaxial with the aperture in the substrate, each of the conductive layers extending from an outer periphery of the conductive layers to the inner periphery thereof. A plurality of insulated conductive signal lines lying in a common plane are disposed on the substrate, where the signal lines include associated external conductive signal pads adjacent the outer periphery of the substrate and oppositely disposed internal conductive signal pads adjacent the inner periphery of the substrate. Further, the invention comprises electrical coupling means associated with the chip conductive terminal pads, the internal conductive pads, and the planar conductive layers for conductively connecting selected ones of the chip terminal pads to selected ones of the internal signal pads and the conductive layers by relatively short non-overlapping leads.

In accordance with one embodiment of the invention, the plurality of conductive layers are disposed below the substrate, while in accordance with another embodiment, they are disposed above the substrate, one of the layers being at ground potential and providing a ground plane.

The invention may also include a decoupling capacitor connected between each of the non-grounded conductive layers and the ground plane.

Thus it can be seen that the present invention is an IC chip carrier including means for connecting any IC terminal pad of an IC carried by a carrier to either of several operating potentials, a ground plane, or to an input or output (I/O) signal line. By including voltage and ground planes on the chip carrier, voltage drops can be minimized and usually the need for physically wider power and ground traces on the package can be eliminated. The invention also provides built-in chip capacitors to minimize voltage variations. Further, termination resistors may be printed as an integral part of the carrier adjacent to the external pads. This permits the characteristic impedance of the signal lines to be maintained and prevents unwanted signal reflection from occurring.

It is therefore an object of the present invention to provide a new and improved integrated circuit chip carrier.

It is another object of the present invention to provide an integrated circuit chip carrier that can be customized to match the requirements of any integrated circuit.

It is still another object of the present invention to provide a selectable integrated circuit chip carrier that includes voltage and ground planes in the chip carrier to minimize voltage drops and the need for wide power and ground traces.

It is yet another object of the present invention to provide a selectable IC chip carrier that accommodates at least four chip capacitors to minimize voltage variations, and termination resistors adjacent to external carrier pads to prevent unwanted signal reflections from occurring.

It is a further object of the present invention to provide a selectable IC carrier that can be readily produced to accommodate a newly designed special I.C. chip.

The features of the present invention which are believed to be novel are set fourth with particularity in the appended claims. The present invention, both as to its organization and manner of operation and use, together with further objects and advantages thereof, may best be understood by making reference to the following description taken in conjunction with the accompanying drawings in which like reference characters refer to like elements in the several views.

BRIEF DESCRIPTION OF THE DRAWINGS

FIG. 3 is an enlarged sectional view of a portion of the chip carrier of FIG. 1;

FIG. 4 is an enlarged sectional representation of a portion of a selectable chip carrier in accordance with another embodiment of the present invention;

DETAILED DESCRIPTION OF THE PREFERRED EMBODIMENTS

Figure 1:
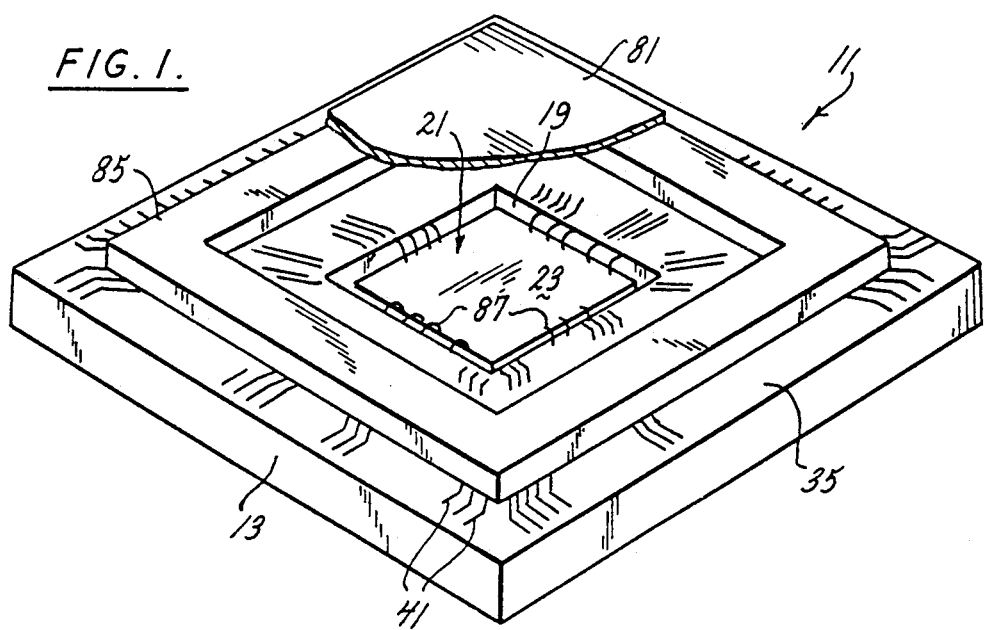
FIG. 1 is a perspective view of a presently preferred embodiment of a selectable chip carrier in accordance with the present invention.
Figure 2:
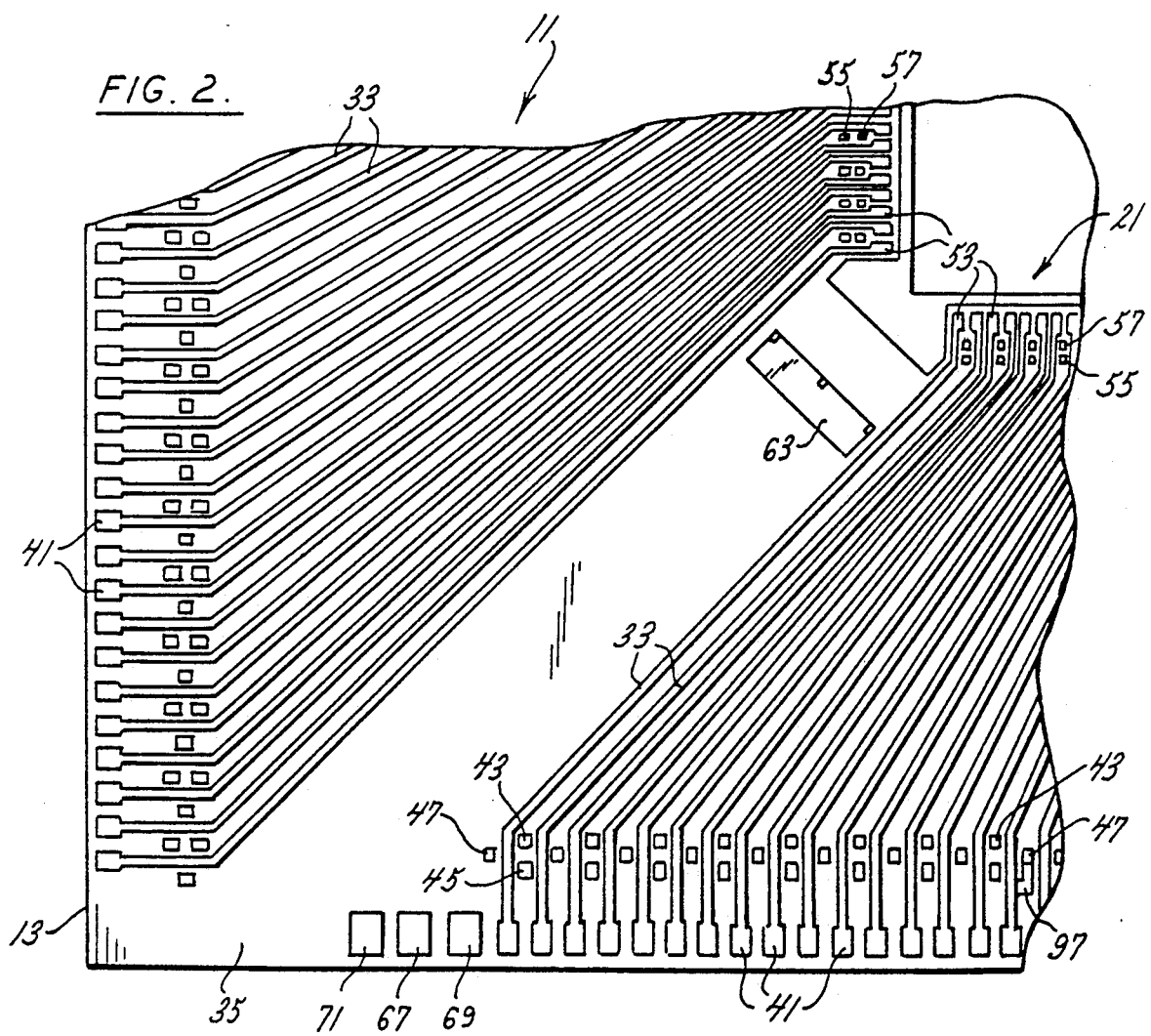
FIG. 2 is a top plan view showing a corner portion of the upper substrate surface of the selectable chip carrier of FIG. 1.

Referring now to the drawings and more particularly to FIGS. 1-3, there is shown a selectable chip carrier 11 having a ceramic or Alumina substrate structure 13 soldered or brazed at 15 to a BeO or metallic base plate 17. The structure 13 includes a rectangular opening 19 generally centrally thereof defining a cavity 21 which is sized to accommodate an integrated circuit chip 23 having a plurality of electrode pads 25 disposed around the periphery of the chip.

In this embodiment, disposed below the lower portion of the substrate structure 13 is a sandwich structure 26 which includes a lower ground plane layer 27, an intermediate first voltage plane layer 29, and an upper second voltage plane layer 31, each layer being separated by dielectric layers 32. An input/output signal line pattern of conductive lead traces 33 is disposed by any conventional means on the upper surface 35 of the substrate structure 13, as best seen in FIG. 2.

FIG. 2 also best illustrates the internal and external conductive pad layout relating to the two voltage planes and to the I/O signal traces. For example, the external ends of the signal lines 33 are provided with 6 mil by 10 mil pads 41 on 12 mil centers, while 4 mil by 8 mil pads 43, 45, and 47 are provided for the two voltage planes 29 and 31 and the ground plane 27, respectively. As can be seen from the figure, the voltage pads 43 and 45 are grouped in pairs between alternate pairs of the signal line traces 33, while a single ground plane pad 47 is disposed adjacent the side of those signal line traces opposite the voltage pads. Each of the voltage and ground plane pads communicate with an associated one of the voltage planes and the ground plane through 2 mil vias 49 and 51 in the substrate, as seen in FIG. 3.

The very important internal pad arrangement of the invention provides for the placement of a close grouping of potential, ground, and signal pads immediately adjacent every terminal pad on an IC chip disposed in the cavity 21. For example, 4 mil by 8 mil signal pads 53 on 6 mil centers are disposed at the inner ends of the signal lines 33, and 3 mil by 4 mil voltage pads 55 and 57 are disposed between different pairs of the signal line pads, as shown. Access to the ground plane 27 is provided to the IC pads by way of its connection to a metalization 59 along the entire inner surface of the rectangular opening 19 in the substrate, which metalization includes a 4 mil wide bus 61 around the top of the cavity 21.

Adjacent the four corners of the cavity 21 are four relatively broad conductive pads 63 (only one being shown) disposed on the substrate 13 and each is adapted to accommodate a corresponding chip capacitor 65, where diagonally opposite ones of these capacitors bypass (decouple) each of the voltage planes to the ground plane. Also, additional, relatively broad, power pads and ground pads (not all shown) are located adjacent to each external grouping of pads near the four external corners of the substrate (FIG. 2). Two of these pads 67, 69 are connected to different ones of the voltage planes, and the third pad 71 is connected to the ground plane 27. All connections of these pads to their respective planes are made through conventional 2 mil vias in the substrate. Vias 73 and 75 are also provided in the substrate to connect the two voltage planes to associated internal voltage pads 55 and 57.

The selectable chip carrier 11 further includes a metal lid or cover plate 81 which is sealed by means of a conventional sealing metalization 83 to an annular cover seal element 85 which is, in turn, permanently attached to the upper surface 35 of the substrate, generally centrally over the cavity 21, by a conventional glass seal metalization 86.

From these figures it can be seen that each chip pad 25 is immediately adjacent the grouping of the 4 mil ground bus 61, each internal voltage pad 55 and 57, and an associated internal I/O signal pad 53. Thus, customization can be easily accomplished by connecting each chip pad 25 by a very short internal wire bond 87, (or also an external wire bond 89, or the like), to either a desired signal, potential, or to ground. Also, any internal I/O pad 53 may be connected by an internal wire bond jumper 87 to an adjacent voltage pad 55 or 57. The external wire bonds 89 may be protected from short circuits by a bead 91 of conventional encapsulation material applied after the package cover 81 has been installed.

As best illustrated in FIG. 3, package leads (those leading from the selectable chip carrier 11 to external circuitry), may be formed by conventional Tape Automated Bonding (TAB) structure 93, the upper portions 95 of which make contact with the peripherally disposed external pads of the structure 11.

An additional feature of the present invention is that it permits the addition of termination resistors 97 (only one being shown in FIG. 2) between an external signal pad and an adjacent external ground pad. These resistors can be formed using conventional thick or thin film techniques.

In accordance with still another embodiment of the present invention, as shown in FIG. 4, a selectable chip carrier 101 comprises a substrate 103, a base plate 105, an opening 107, a cavity 109, a ground plane layer 111, signal line traces 113, a cavity wall metalization 115, an internal peripheral ground bus 117, a cover plate 119, and a seal ring structure 121, similar to comparable elements in the first described embodiment. However, unlike the previously described structure, an optional ground plane 123 and the two voltage planes 125 and 127 are located above the substrate 103. Of course, all conductive layers are suitably insulated from each other by conventional dielectric insulation layers 128.

Interconnections between these conductive planes and the I/O signal line pattern 113, which is disposed directly on the substrate's upper surface 129, is accomplished by wire bonds 131 located adjacent to the internal I/O pads. As in the first embodiment, dedicated power pads and ground pads are located in each corner of the structure 101. These pads insure that the ground and voltage planes can adequately meet the voltage and current requirements of an IC chip 139 disposed in the cavity 109.

In the embodiment of FIG. 4, a second set of signal pads 141, each connected by an associated via 143 to an associated one of the signal line traces 113, are provided around the bottom edge 145 of the substrate 103. These can be used with an elastomeric connector (not shown) to test the IC 139 after it has been installed in the chip carrier 101 and before the metal cover plate 119 and the package leads of a TAB structure (not shown) have been installed.

Figure 5:
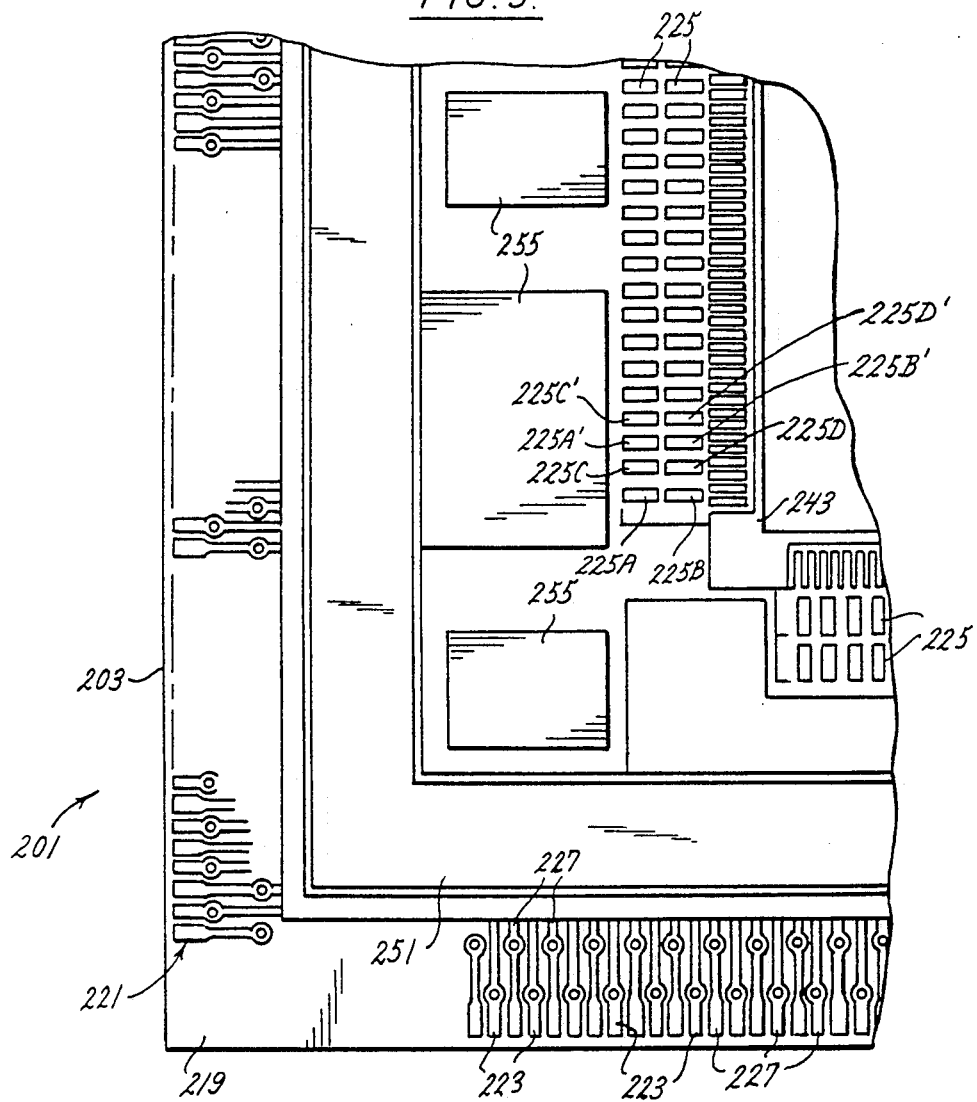
FIG. 5 is an enlarged top plan view of a corner portion of still another embodiment of the invention.
Figure 6:
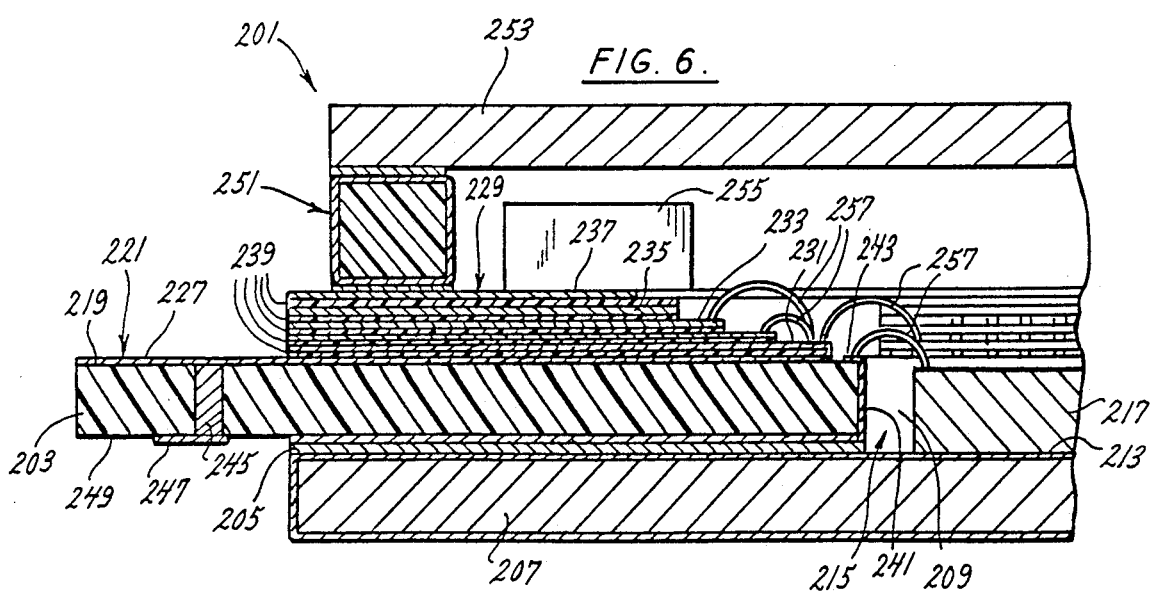
FIG. 6 is a side elevational representation, in section, of the embodiment of FIG. 5.

Still another embodiment of the invention is illustrated in FIGS. 5 and 6. Here, a selectable chip carrier 201 includes a substrate structure 203 soldered or brazed using a high temperature solder 205 to a base plate 207. The base plate may be copper or BeO, for example, and is similar to the base plate described in the previously described embodiments. The substrate 203 has an aperture 209, which with the upper surface 213 of the base plate 207, defines a pocket or cavity 215 large enough to accommodate a chip 217.

Disposed on the upper surface 219 of the substrate 203 is a conductive film that has been appropriately masked and etched to provide an I/O lead pattern layer 221 with leads 223, and internal pads 225 and corresponding external pads 227 which are disposed at opposite ends of each lead 223.

In a multilayer structure 229 disposed on the lead pattern layer 221, there is provided a first thick film plane 231, a second thick film plane 233, a third thick film plane 235, and a fourth thick film plane 237, each such layer being electrically insulated by a non-conductive dielectric layer 239. These thick film planes each include an external or package pad for connection through package leads to a desired voltage or current source or to ground, if an additional ground plane is desired. As in the previously described embodiments, the inner wall surface of the aperture 209 is plated with a conductive material 241 such as copper, which plating extends from the grounded plate or layer 207 over to the upper surface 219 of the substrate to form a 4 mil wide ground bus 243.

Each of the thick film planes also includes an aperture coaxial with the opening 209 in the substrate 203. In this embodiment, vias 245 are provided in the substrate 203 connecting each external signal pad 227 to an associated test signal pad 247 disposed on the lower surface 249 of the substrate. Of course, as in the previous embodiment, vias are provided through the substrate and conductive layers to allow insulated connection between conductive pads and desired leads or layers, as is well known in the art.

Similar to the annular cover seal element 85, this embodiment utilizes an annular cover seal element 251 disposed on the uppermost layer of the structure 229. Also, a cover plate 253 is sealed to the upper surface of the element 251 as has been previously described, in order to provide a hermetically sealed environment for the enclosed IC chip 217. Decoupling capacitors 255 are also disposed on the uppermost layer of the structure 229, each capacitor being provided with insulated vias (not shown) to respective ground and potential layers (best seen in FIG. 5 with cover removed).

FIG. 5 also provides the best view of the internal conductive pads 225 which connect through vias (not shown) to respective ones of the conductive thick film planes 231-237. For example, each adjacent group of four such pads 225A, 225B, 225C and 225D connect, respectively, to first plane 231, second plane 233, third plane 235, and fourth plane 237. In this regard it should be noted that the stepped layer inner edge configuration shown in FIG. 6 is for illustration of function. In practice, the configuration of FIG. 5 is utilized, where the pads 255 are all disposed on the upper dielectric surface 239, and each pad communicated with a corresponding thick film plane through vias (not shown). Thus, short internal wire bonds 257 may be used to signal lead pad 225 or to any of the associated internal ground/voltage plane pads 255 without the necessity of any of the wire bonds 257 crossing another.

The selectable chip carrier according to the present invention can be implemented as a family of standard packages each designed for a different IC package or die size. The pad count for each package would be determined by the maximum number of pads that can be arranged around the die cavity.

Although the invention is intended to be used for packaging individual integrated circuits, small multiples of integrated circuits could be accommodated provided that they fit in the die cavity.

The uniqueness of the present invention is that it permits any of the pads of an IC disposed in the cavity to be connected to either of the two or more voltage planes or to the ground plane provided internally by the inventive structure. This permits a standard chip carrier to be customized to meet the requirements of a variety of integrated circuits, and eliminates the need to design a custom chip carrier for each iteration of a custom integrated circuit.

What is claimed is:

1. A selectable chip carrier adapted to receive an integrated circuit chip which has a plurality of conductive terminal pads disposed about its periphery, and adapted to communicate with selected ones of the terminal pads, the selectable chip carrier comprising:
    a base plate having:
        an upper surface adapted to support an integrated circuit chip;
    a dielectric substrate having:
        an outer periphery;
        an upper planar surface;
        a lower planar surface supported by said upper surface of said base plate; and
        an aperture therethrough for accommodating an integrated circuit chip, said aperture defining an inner peripheral surface of said dielectric substrate;

a plurality of parallel and insulatively separated planar conductive layers disposed adjacent one of said planar surfaces of said substrate, said conductive layers each including:
  an outer periphery; and
  an integrated circuit chip-accommodating aperture therethrough defining an inner periphery generally coaxial with said aperture in said dielectric substrate, each of said conductive layers extending from its outer periphery to its inner periphery;
a plurality of insulated conductive signal lines lying in a common plane and disposed on said dielectric substrate, said signal lines each including;
  associated external conductive signal pads adjacent said outer periphery of said dielectric substrate; and
  oppositely disposed internal conductive signal pads adjacent said inner periphery of said dielectric substrate;
electrical coupling means for association with the chip conductive terminal pads, and associated with said internal conductive pads and said planar conductive layers for conductively connecting selected ones of the chip terminal pads to selected ones of said internal signal pads and said conductive layers; and
a metalization layer disposed along said inner peripheral surface of said dielectric substrate, said metalization layer being electrically connected to said ground plane and including:
  a bus disposed on said upper planar surface of said dielectric substrate around said integrated circuit chip-accommodating aperture thereof.

2. The selectable chip carrier according to claim 1, wherein said plurality of conductive layers are disposed below said dielectric substrate.

3. The selectable chip carrier according to claim 1, wherein said plurality of conductive layers are disposed above said dielectric substrate.

4. The selectable chip carrier according to claim 1, wherein said electrical coupling means includes relatively short non-overlapping internal wire bonds conductively connecting the selected ones of the chip terminal pads to said selected ones of said internal signal pads and said conductive layers.

5. The selectable chip carrier according to claim 1, also comprising at least one decoupling capacitor electrically coupled between said at least one conductive layer that is a ground plane and a selected other one of said conductive layers.

6. The selectable chip carrier according to claim 1, wherein said plurality of conductive layers comprises:
  four conductive layers, and wherein said carrier further includes:
  at least three decoupling capacitors electrically coupled between said ground plane and a different one of said conductive layers.

7. The selectable chip carrier according to claim 1, wherein said electrical coupling means includes relatively short internal wire bonds conductively connecting the selected ones of the chip terminal pads to said selected ones of said internal signal pads, said conductive layers, and said bus.

8. The selectable chip carrier according to claim 1, wherein said plate, said substrate, and said plurality of conductive layers are of rectangular shape defining four outer side edges.

9. The selectable chip carrier according to claim 8, wherein said conductive signal lines comprise four groups of adjacent conductive signal lines, each group extending outwardly toward a different one of said four outer side edges.

10. The selectable chip carrier according to claim 9, also comprising:
  four conductive pads, each of said four conductive pads being disposed between different groups of said four groups of said signal lines; and
  four decoupling chip capacitors, each disposed on and electrically connected to different ones of said conductive pads, said chip capacitors which are located at diagonal corners of said rectangular shape also being electrically connected to the same planar conductive layer.

11. The selectable chip carrier according to claim 1, also comprising:
  a cover assembly including a cover plate, mounted above, covering, and hermetically sealing said electrical coupling means and integrated circuit chip thereunder.

12. The selectable chip carrier according to claim 11, wherein said cover plate assembly also includes:
  an annular member disposed between said substrate and said cover plate.

13. The selectable chip carrier according to claim 11, wherein said cover plate is metallic.

* * * * *